US011820908B2

(12) United States Patent
Churchill et al.

(10) Patent No.: US 11,820,908 B2
(45) Date of Patent: Nov. 21, 2023

(54) EXTERIOR COATING FOR ALUMINUM AND GLASS

(71) Applicant: SWIMC LLC, Cleveland, OH (US)

(72) Inventors: Michael Churchill, Carrollton, TX (US); Tonya Trabosh, Flower Mound, TX (US); Brooke Despain, Wylie, TX (US)

(73) Assignee: SWIMC LLC, Cleveland, OH (US)

( * ) Notice: Subject to any disclaimer, the term of this patent is extended or adjusted under 35 U.S.C. 154(b) by 484 days.

(21) Appl. No.: 17/046,081

(22) PCT Filed: Apr. 9, 2019

(86) PCT No.: PCT/US2019/026529
§ 371 (c)(1),
(2) Date: Oct. 8, 2020

(87) PCT Pub. No.: WO2019/199782
PCT Pub. Date: Oct. 17, 2019

(65) Prior Publication Data
US 2021/0130641 A1    May 6, 2021

Related U.S. Application Data

(60) Provisional application No. 62/655,265, filed on Apr. 10, 2018.

(51) Int. Cl.
*C09D 127/16* (2006.01)
*E04C 2/08* (2006.01)
*H01L 31/048* (2014.01)
*B05D 5/08* (2006.01)

(52) U.S. Cl.
CPC .............. *C09D 127/16* (2013.01); *E04C 2/08* (2013.01); *H01L 31/048* (2013.01)

(58) Field of Classification Search
CPC combination set(s) only.
See application file for complete search history.

(56) References Cited

U.S. PATENT DOCUMENTS

| 4,684,677 | A | 8/1987 | Higginbotham et al. |
| 4,795,777 | A * | 1/1989 | Higginbotham ..... C09D 127/16 524/441 |
| 6,017,639 | A | 1/2000 | Higginbotham et al. |
| 2015/0034148 | A1 | 2/2015 | May |

(Continued)

FOREIGN PATENT DOCUMENTS

| CA | 2981895 | 11/2016 |
| CN | 101531852 | 9/2009 |

(Continued)

OTHER PUBLICATIONS

English language machine translation of CN 101531852 A (Year: 2009).*

(Continued)

*Primary Examiner* — Ramsey Zacharia

(57) ABSTRACT

A one-coat system and coating composition for application to a tempered glass or primed metal surface are described. The coating includes a dispersed fluoropolymer resin composition and an adhesion promoter. When cured, the one-coat system meets the specifications for a high performance exterior coating system.

11 Claims, 1 Drawing Sheet

(56) References Cited

U.S. PATENT DOCUMENTS

| | | |
|---|---|---|
| 2015/0132582 A1 | 5/2015 | Auman et al. |
| 2015/0240105 A1 | 8/2015 | Jing et al. |
| 2015/0299497 A1 | 10/2015 | May et al. |
| 2015/0299498 A1 | 10/2015 | Schwartz et al. |
| 2016/0096975 A1 | 4/2016 | Saito et al. |
| 2018/0001343 A1 | 1/2018 | Aruga |

FOREIGN PATENT DOCUMENTS

| | | |
|---|---|---|
| CN | 104151953 | 11/2014 |
| CN | 104817903 | 8/2015 |
| WO | 2016183272 | 11/2016 |
| WO | 2017132261 | 8/2017 |

OTHER PUBLICATIONS

First Office Action issued for corresponding Chinese patent application no. 201980024580.9, dated Aug. 20, 2021 (16 pages, including English translation).
International Search Report for international application No. PCT/US2019/026529, dated Jun. 12, 2019 (6 pages).
Written Opinion for international application No. PCT/US2019/026529, dated Jun. 12, 2019 (7 pages).

\* cited by examiner

EXTERIOR COATING FOR ALUMINUM AND GLASS

BACKGROUND OF THE INVENTION

Various methods of coating substrates for durable exterior use are known. One method of coating includes extrusion coating a substrate, typically a metal substrate, with a thermoplastic material. Such extrusion-coated articles can be used in a wide variety of applications, including, for example, as exterior building products, construction materials, roofs, furniture, and the like. Extrusion coatings may also be used in specialized applications such as on solar panels, for example.

Solar panels, also called solar energy collective devices, typically include a glass housing for one or more photovoltaic cells or materials. The glass housing is typically loaded or placed into a mechanical structure or frame. Conventionally, the frame is made of metal, typically aluminum with a primer applied thereon.

In order to increase the exterior durability of solar panels, it is conventional to coat both glass and metal surfaces with a coating that meets industry standards for high performance exterior coatings, such as the AAMA 2605 specification, for example. Typically, one particular type of coating is applied to the glass surfaces, and a different coating is applied to the primed aluminum surfaces. This results in increased material costs and time consumption in coating solar panels.

Moreover, some coatings applied to the glass surfaces of solar panels demonstrated poor adhesion, possibly due to contamination of the glass surface. Conventional attempts to remove such contaminants with isopropyl alcohol prior to applying a protective coating do not necessarily remove all the contamination resulting in a poorly adhered coating that may not meet the requirements for a high performance exterior coating.

Therefore, there is a need for a coating system that may be applied to both glass and metal surfaces and demonstrate optimal performance when used as a high performance exterior coating, and also for methods of applying such coatings that effectively remove contaminants from surfaces to be coated.

SUMMARY

Figure 1B:
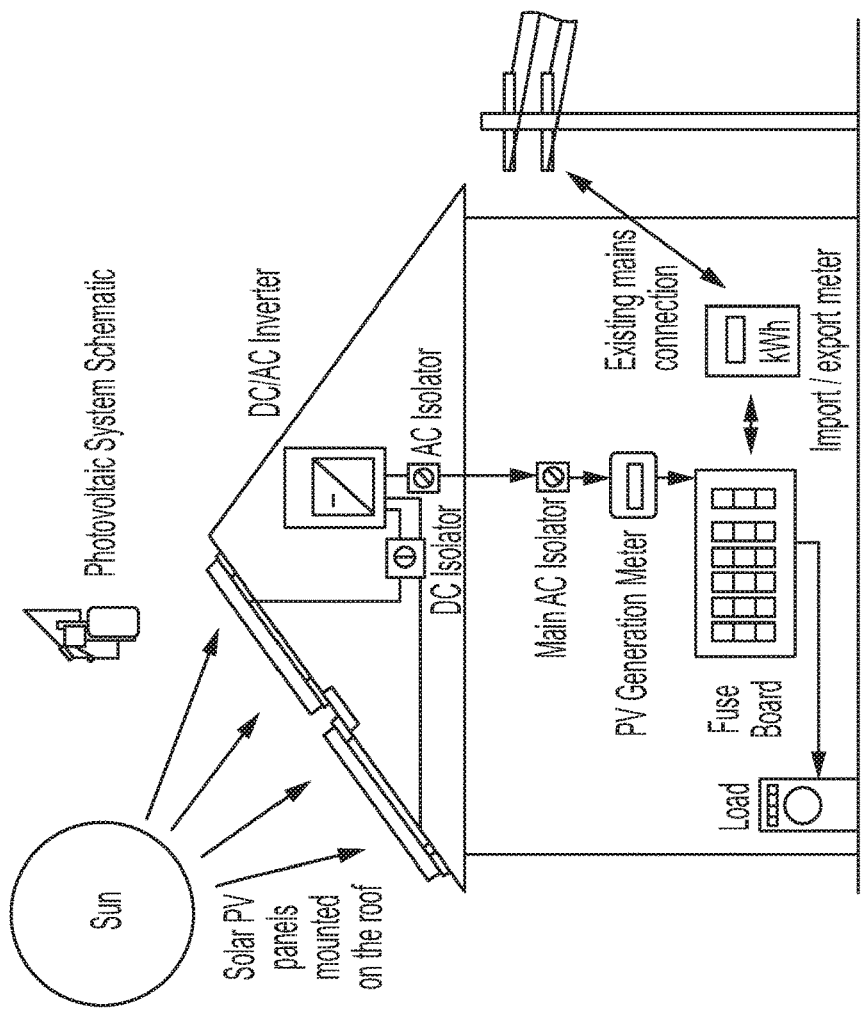
FIG. 1 depicts a graphical representation of a photovoltaic cell as part of a solar panel assembly, and a solar panel assembly mounted on a roof.

The present description provides a one-coat system that includes a substrate, a dispersed fluoropolymer resin composition, and an adhesion promoter. In an embodiment, the one-coat system described herein is a high performance exterior coating system.

In another embodiment, the present description provides a coating composition including a dispersed fluoropolymer resin composition. The resin composition includes at least one resin component comprising at least about 10 percent by weight of polyvinylidene difluoride units, based on the total weight of the composition. The resin composition also includes at least one organic solvent and at least one amino-functional crosslinker. In addition to the resin composition, the coating composition further includes an adhesion promoter.

In another embodiment, a method is provided herein including the steps of providing a substrate and applying on the substrate a coating composition that includes a dispersed fluoropolymer resin composition. The resin composition includes at least one resin component comprising at least about 10 percent by weight of polyvinylidene difluoride units, based on the total weight of the composition. The resin composition also includes at least one organic solvent and at least one amino-functional crosslinker. In addition to the resin composition, the coating composition further includes an adhesion promoter. The method further includes a step of baking the coating applied to the substrate at a temperature of at least 230 C for at least 10 minutes to obtain a cured film that meets the specifications of a high performance exterior coating system.

In yet another embodiment, the present description provides a coated article. The article includes a substrate with a cured film disposed thereon. The cured film is derived from a coating composition that includes a dispersed fluoropolymer resin composition. The resin composition includes at least one resin component comprising at least about 10 percent by weight of polyvinylidene difluoride units, based on the total weight of the composition. The resin composition also includes at least one organic solvent and at least one amino-functional crosslinker. In addition to the resin composition, the coating composition further includes an adhesion promoter. The coated article with the cured coating disposed thereon meets the specifications of a high performance exterior coating system.

The details of one or more embodiments of the invention are set forth in the accompanying drawings and/or the description below. Other features, objects, and advantages of the invention will be apparent from the description and/or drawings, and from the claims.

Selected Definitions

Unless otherwise specified, the following terms as used herein have the meanings as provided below.

As used herein, the term "organic group" means a hydrocarbon group (with optional elements other than carbon and hydrogen, such as oxygen, nitrogen, sulfur, and silicon) that is classified as an aliphatic group, cyclic group, or combination of aliphatic and cyclic groups (e.g., alkaryl and aralkyl groups). The term "aliphatic group" means a saturated or unsaturated linear or branched hydrocarbon group. This term is used to encompass alkyl, alkenyl, and alkynyl groups, for example. The term "alkyl group" means a saturated linear or branched hydrocarbon group including, for example, methyl, ethyl, isopropyl, t-butyl, heptyl, dodecyl, octadecyl, amyl, 2-ethylhexyl, and the like. The term "alkenyl group" means an unsaturated, linear or branched hydrocarbon group with one or more carbon-carbon double bonds, such as a vinyl group. The term "alkynyl group" means an unsaturated, linear or branched hydrocarbon group with one or more carbon-carbon triple bonds. The term "cyclic group" means a closed ring hydrocarbon group that is classified as an alicyclic group or an aromatic group, both of which can include heteroatoms. The term "alicyclic group" means a cyclic hydrocarbon group having properties resembling those of aliphatic groups. The term "Ar" refers to a divalent aryl group (i.e., an arylene group), which refers to a closed aromatic ring or ring system such as phenylene, naphthylene, biphenylene, fluorenylene, and indenyl, as well as heteroarylene groups (i.e., a closed ring hydrocarbon in which one or more of the atoms in the ring is an element other than carbon (e.g., nitrogen, oxygen, sulfur, etc.)). Suitable heteroaryl groups include furyl, thienyl, pyridyl, quinolinyl, isoquinolinyl, indolyl, isoindolyl, triazolyl, pyrrolyl, tetrazolyl, imidazolyl, pyrazolyl, oxazolyl, thiazolyl, benzofuranyl, benzothiophenyl, carbazolyl, benzoxazolyl, pyrimidinyl, benzimidazolyl, quinoxalinyl, benzothiazolyl, naphthyridinyl, isoxazolyl, isothiazolyl, purinyl, quinazolinyl, pyrazinyl, 1-oxidopyridyl, pyridazinyl, triazinyl, tetrazinyl, oxadiazolyl, thiadiazolyl, and so on. When such groups are divalent, they are typically referred to as "heteroarylene" groups (e.g., furylene, pyridylene, etc.)

A group that may be the same or different is referred to as being "independently" something. Substitution is anticipated on the organic groups of the compounds of the present invention. As a means of simplifying the discussion and recitation of certain terminology used throughout this application, the terms "group" and "moiety" are used to differentiate between chemical species that allow for substitution or that may be substituted and those that do not allow or may not be so substituted. Thus, when the term "group" is used to describe a chemical substituent, the described chemical material includes the unsubstituted group and that group with O, N, Si, or S atoms, for example, in the chain (as in an alkoxy group) as well as carbonyl groups or other conventional substitution. Where the term "moiety" is used to describe a chemical compound or substituent, only an unsubstituted chemical material is intended to be included. For example, the phrase "alkyl group" is intended to include not only pure open chain saturated hydrocarbon alkyl substituents, such as methyl, ethyl, propyl, t-butyl, and the like, but also alkyl substituents bearing further substituents known in the art, such as hydroxy, alkoxy, alkylsulfonyl, halogen atoms, cyano, nitro, amino, carboxyl, etc. Thus, "alkyl group" includes ether groups, haloalkyls, nitroalkyls, carboxyalkyls, hydroxyalkyls, sulfoalkyls, etc. On the other hand, the phrase "alkyl moiety" is limited to the inclusion of only pure open chain saturated hydrocarbon alkyl substituents, such as methyl, ethyl, propyl, t-butyl, and the like.

The term "component" refers to any compound that includes a particular feature or structure. Examples of components include compounds, monomers, oligomers, polymers, resins, and organic groups contained there.

The term "crosslinker" refers to a molecule capable of forming a covalent linkage between polymers or between two different regions of the same polymer, or between one or more polymers or different regions of a polymer and a given substrate.

The term "self-crosslinking," when used in the context of a self-crosslinking polymer, refers to the capacity of a polymer to enter into a crosslinking reaction with itself and/or another molecule of the polymer, in the absence of an external crosslinker, to form a covalent linkage therebetween. Typically, this crosslinking reaction occurs through reaction of complimentary reactive functional groups present on the self-crosslinking polymer itself or two separate molecules of the self-crosslinking polymer.

The term "dispersion" in the context of a dispersible polymer refers to the mixture of a dispersible polymer and a carrier. The term "dispersion" is intended to include the term "solution."

The term "thermoplastic" refers to a material that melts and changes shape when sufficiently heated and hardens when sufficiently cooled. Such materials are typically capable of undergoing repeated melting and hardening without exhibiting appreciable chemical change. In contrast, a "thermoset" refers to a material that is crosslinked and does not "melt."

Unless otherwise indicated, a reference to a "(meth) acrylate" compound (where "meth" is bracketed) is meant to include both acrylate and methacrylate compounds.

The term "polycarboxylic acid" includes both polycarboxylic acids and anhydrides thereof.

The term "on", when used in the context of a coating applied on a surface or substrate, includes both coatings applied directly or indirectly to the surface or substrate. Thus, for example, a coating applied to a primer layer overlying a substrate constitutes a coating applied on the substrate.

The term "volatile organic compound" ("VOC") refers to any compound of carbon, excluding carbon monoxide, carbon dioxide, carbonic acid, metallic carbides or carbonates, and ammonium carbonate, which participates in atmospheric photochemical reactions. Typically, volatile organic compounds have a vapor pressure equal to or greater than 0.1 mm Hg. As used herein, "volatile organic compound content" ("VOC content") means the weight of VOC per volume of the coating solids, and is reported, for example, as kilograms (kg) of VOC per liter.

Unless otherwise indicated, the term "polymer" includes both homopolymers and copolymers (i.e., polymers of two or more different monomers).

The term "comprises" and variations thereof do not have a limiting meaning where these terms appear in the description and claims.

The terms "preferred" and "preferably" refer to embodiments of the invention that may afford certain benefits, under certain circumstances. However, other embodiments may also be preferred, under the same or other circumstances. Furthermore, the recitation of one or more preferred embodiments does not imply that other embodiments are not useful, and is not intended to exclude other embodiments from the scope of the invention.

As used herein, "a," "an," "the," "at least one," and "one or more" are used interchangeably. Thus, for example, a coating composition that comprises "an" additive can be interpreted to mean that the coating composition includes "one or more" additives.

Also herein, the recitations of numerical ranges by endpoints include all numbers subsumed within that range (e.g., 1 to 5 includes 1, 1.5, 2, 2.75, 3, 3.80, 4, 5, etc.). Furthermore, disclosure of a range includes disclosure of all subranges included within the broader range (e.g., 1 to 5 discloses 1 to 4, 1.5 to 4.5, 1 to 2, etc.).

DETAILED DESCRIPTION

The present description provides a one-coat system for application to a wide variety of substrates including metal, e.g., primed metal, glass, e.g., tempered glass, and the like. The system includes a dispersed fluoropolymer resin composition and an adhesion promoter. In an aspect, the one-coat system described herein meets the specifications of a high performance exterior coating, preferably the AAMA 2605 specification (Voluntary Specification, Performance Requirements and Test Procedures for Superior Performing Organic Coatings on Aluminum Extrusions and Panes). Coating systems that meet the AAMA 2605 specification demonstrate outstanding resistance to humidity, color change, gloss loss, chalk, and chemicals.

In an embodiment, the present description provides a coating composition. The coating composition includes a dispersed fluoropolymer resin composition. The fluoropolymer resin composition includes at least a fluoropolymer dispersion, i.e., a dispersion of the fluoropolymer resin particles in an organic solvent, such as a non-aromatic ketone or ester. If the resin particle size is too large, stability problems may be experienced with the dispersion. Typically, the average particle size is about 1 to about 15 micron, and preferably about 2 to about 8 micron. Generally, the present composition includes at least about 10 wt. %, 20 wt. %, 30 wt. %, preferably at least about 35 wt. % and, more preferably, about 40 to 50 wt. % of a vinylidene difluoride-based polymer (based on the total weight of the coating composition). The vinylidene difluoride-based polymer typically makes up at least about 50 wt. % and preferably at least about 60 wt. %, more preferably 70 wt. % of the resin solids present in the composition.

Preferred versions of the present composition include about 35 to 45 wt. % resin solids which includes at least about 50 wt. % PVDF, preferably about 70 wt. % PVDF, and at least about 10 wt. % of a thermoplastic acrylic polymer, preferably about 30 wt. % of the thermoplastic acrylic polymer. More preferably, the coating compositions include about 65 to 72 wt. % PVDF and about 10 to about 28 wt. % of the thermoplastic acrylic polymer, e.g. a copolymer of one or more lower alkyl (C1-C6 alkyl) methyacrylate esters and/or one or more lower alkyl acrylate esters. In a preferred aspect, where the coating composition must meet AAMA 2605 specification, the composition includes at least 70 wt % PVDF, but no more than 72 wt % PVDF, and at least 15 wt % of the acrylic polymer, but no more than 30 wt % of the acrylic polymer. A coating composition that includes more than 30 wt % of the thermoplastic acrylic polymer will not have the ultraviolet (UV) or moisture resistance required for a high performance exterior coating.

Several different film-forming fluoropolymers are useful in the present invention, such as polyvinylidene difluoride and various vinylidene difluoride copolymers. The film-forming fluoropolymer resin typically includes PVDF having a $M_w$ of about 400,000 to about 500,000, a $M_w/M_n$ ratio of about 2.5 to about 4.0. More preferably, the polyvinylidene difluoride has a $M_w$ of about 420,000 to about 480,000, a $M_w/M_n$ ratio of about 2.4 to about 3.4, and/or a melting point of about 150 to about 170° C. One example of a commercially available polyvinylidene difluoride which is particularly suitable for use in the present composition is FLUROPON (available from Sherwin Williams).

Although in some embodiments, vinylidene difluoride copolymers including at least about 75 percent by weight, preferably 90 percent or more of vinylidene difluoride monomer units may be employed, the film-forming fluoropolymer in the compositions described herein preferably includes 100% vinylidene difluoride monomers, i.e. the fluoropolymer is preferably a homopolymer of vinylidene difluoride monomers. Typically, all of the monomers used to form a fluorinated hydrophobic homopolymer described herein include two fluorine atoms covalently bonded to a carbon atom of a carbon-carbon double bond. This arrangement can be represented as $F_2C=CH_2$. Without limiting to theory, it is believed that no other arrangement of molecules would produce a polymer with equivalent properties as required for the high performance exterior coating described herein.

In an embodiment, the present description includes a fluoropolymer dispersion, i.e., a dispersion of the fluoropolymer resin particles in an organic solvent, the term "solvent" here being used to mean a combination of latent solvents and non-solvents. A wide variety of organic solvents may be used to formulate the present fluoropolymer dispersions. The organic solvent typically acts as a latent solvent for the fluoropolymer; that is, the fluoropolymer is substantially insoluble and dispersed in the solvent at room temperature but becomes solvated or dissolved in the solvent when the composition is heated. The solvent generally makes up about 25 to about 70 wt. % and, preferably, about 40 to about 60 wt. % of the composition. Without limiting to theory, it is believed that, for spray coating applications as described herein, a suitable PVDF dispersion could not reasonably include less than about 40 wt % of the composition.

Preferably the solvent component described herein includes both latent solvents and non-solvents. Suitable solvents which may be used in the present invention include aromatic solvents, non-aromatic solvents, alcohols, ketones, ketone-alcohols, glycol ethers (e.g., propylene glycol, butylene glycol, and the like), glycerol ether acetates (e.g., propylene glycols, butylene glycols, and the like), and the like, and mixtures or combinations thereof Suitable non-solvents include plasticizers such as dimethyl phthalate (DMP), 2,2,4-trimethyl-1,3-pentanediol diisobutyrate (TXIB), and the like, and mixtures or combinations thereof.

Preferably, for the compositions described herein, the amount of ketones (aromatic or non-aromatic), hydroxy-functional solvents, and other polar solvents is very low, i.e. these solvents constitute only a minor portion of the at least 40 wt % of the composition that is made up of solvent. Without limiting to theory, it is believed that ketones, hydroxyl-functional solvents and the like, due to their polarity, have an adverse effect on the application characteristics of the composition. Accordingly, in an embodiment, the majority of the at least 40 wt % of the composition that is made up of solvent includes aromatic solvents, glycol ether acetates, and plasticizers, and mixtures or combinations thereof.

In an embodiment, the present description includes a fluoropolymer dispersion that may include additional polymeric components along with the fluoropolymer particles. In order to improve the hardness and adhesion of the resulting cured film, the composition described herein may include, for example, a hydroxy functional polymer, such as, without limitation, a hydroxy acrylic polymer. Those coating compositions which contain the hydroxy functional polymer typically include a curing agent, such as an aminoplast resin, as well.

The hydroxy functional polymer is subject to wide variation and is typically a solvent-soluble copolymer of monoethylenic monomers containing from about 10 wt. % to about 30 wt. %, preferably 20 to 27 wt % of a hydroxy functional monomer, based on the weight of resin solids in the composition. The hydroxy functionality is generally the only reactive group in the copolymer, although a small amount of carboxylic acid functionality is permissible, though not essential.

Various hydroxy functional monomers can be used, but it is preferred to use an hydroxyalkyl ester of a monocarboxylic acid, such as acrylic acid or methacrylic acid. The alkyl groups contemplated are primarily those containing from 1-4 carbon atoms and illustrated by methyl ethyl, propyl or butyl, however esters of alcohols having up to 12 carbons may be also used. Preferred hydroxy functional monomers include 2-hydroxyethyl acrylate or 2-hydroxyethyl methacrylate. Hydroxy alkyl ethers, such as the hydroxyethyl ether of alkyl alcohol, are also useful.

The hydroxy functional copolymer may be produced by free-radical polymerization of a mixture of monoethylenically unsaturated monomers including the required proportion of a hydroxyalkyl acrylate or methacrylate. The other monomers are preferably acrylic acid, methacrylic acid, or more preferably, methyl methacrylate. Most preferably, the non-hydroxylic monomers include at least about 50% methyl methacrylate, n-butyl methacrylate and/or ethyl acrylate. Small amounts, e.g., about 1-2 wt. %, of a carboxylic acid, like acrylic acid or methacrylic acid, may also be included in the monomer mixture. The hydroxy copolymer is preferably used in an amount of from about 1 to about 15 wt. % and more preferably from about 2 to about 10 wt. % of the composition.

In a preferred aspect, where the coating composition must meet AAMA 2605 specification, the composition includes about 30 wt % of an acrylic component, along with at least 70 wt % PVDF. That is, the ratio of PVDF to acrylic must be 70:30. In an embodiment, the composition described herein is a thermoset composition wherein the vehicle also includes the curing or crosslinking agent, and therefore, the ratio of PVDF to acrylic to curing agent would be 70:27:3.

In an embodiment, the present description includes a fluoropolymer dispersion, i.e., a dispersion of the fluoropolymer resin particles in an organic solvent, along with at least one cross-linker. Those coating compositions which contain the hydroxy functional polymer typically include a curing agent, such as an aminoplast resin, as well.

An aminoplast resin is typically added to the composition in a sufficient amount to cure the hydroxy functional polymer. The weight ratio of the hydroxy functional polymer to the aminoplast resin is typically about 2:1 to about 10:1 and preferably, about 3:1 to about 6:1 to about 9:1. Aminoplast resins are based on the addition products of an aldehyde (preferably formaldehyde), with an amino- or amido-group carrying substance. Examples of suitable aminoplast resins include condensation products obtained from the reaction of alcohols and formaldehyde with melamine, urea or benzoguanamine. These condensation products can be monomeric or polymeric. Condensation products of other amines and amides can also be employed, for example, aldehyde condensates of triazines, diazines, triazoles, guanadines, guanamines and alkyl- and aryl-substituted melamines. Some examples of such compounds are N,N'-dimethyl urea, benzourea, dicyandimide, formaguanamine, acetoguanamine, glycoluril, ammelin 2-chloro-4,6-diamino-1,3,5-triazine, 6-methyl-2,4-diamino-1,3,5-triazine, 3,5-diaminotriazole, triaminopyrimidine, 2-mercapto-4,6-diaminopyrimidine, 3,4,6-tris(ethylamino)-1,3,5-triazine, and the like. While the aldehyde employed is most often formaldehyde, other similar condensation products can be made from other aldehydes, such as acetaldehyde, crotonaldehyde, acrolein, benzaldehyde, furfural, glyoxal and the like.

The preferred aminoplast curing agent is simply a formaldehyde condensate with an amine, preferably melamine, to provide a heat-hardening methylol-functional resin. While many aminoplast resins are broadly useful, such as urea formaldehyde condensates and benzoguanamine formaldehyde condensates, it is preferred that the aminoplast resin be a polyalkoxyalkyl melamine resin in which the alkoxy group contains from 1-4 carbon atoms. Appropriate melamine-formaldehyde condensates are readily available in commerce and are usually etherified with lower alcohols for use in organic solvent solution, as is well known. Examples of suitable aminoplast curing agents include an etherified melamine-formaldehyde condensate as solutions in organic solvent. Commercially available examples of such aminoplast curing agents include the CYMEL line of agents (Cytec), such as, without limitation, CYMEL 303, CYMEL 327, and the like. The aminoplast resin is typically present as from 0.1 to 10 wt. % of total resin solids, and, preferably, in an amount of from 0.2 to 3.0 wt. % of total resin solids. In a preferred aspect, the aminoplast resin is used in an amount sufficient to ensure the dispersed fluoropolymer composition is a thermoset system. In another aspect, when the coating composition described herein is intended for application to glass as well as metal substrates, the amount of aminoplast resin is controlled to prevent reaction of the curing agent with the substrate, i.e. in an amount of no more than 10 wt. % of total resin solids, preferably no more than 6 wt. %, more preferably no more than 3 wt. %.

While aminoplast resins are preferred for curing the hydroxy functional copolymer, it is also possible to use any curing agent reactive with hydroxy functionality, such as phenoplast resins or blocked polyisocyanates. Suitable blocked isocyanate curing agents include isophorone diisocyanate blocked with methyl ethyl ketoxime or octyl alcohol-blocked 2,4-toluene diisocyanate. The class of blocked isocyanate curing agents is well known, and these agents are well known to effect cure by forming urethane groups with the hydroxy functionality on the coating composition when baking causes the blocked isocyanate groups to dissociate and become active.

In an embodiment, the one-coat system described herein includes an adhesion promoter. An adhesion promoter includes any component added to the dispersed fluoropolymer component to form primary bonds to both the substrate and the previously applied coating, thereby anchoring the substrate and the coating together with the specific aim of improving dry or wet adhesion, or both. Suitable adhesion promoters for use in the one-coat system described herein include, without limitation, organo-functional silanes, amino-functional silanes, halosilanes, silazanes, or combinations thereof. In a preferred aspect, one or more organo-functional silanes, or mixtures or combinations thereof.

In a preferred aspect, the adhesion promoter used in the coating system described herein is an organo-functional silane, preferably an organo-functional silane with epoxy functionality, more preferably trimethoxysilane or trimethoxysiloxane with epoxy functionality. Such adhesion promoters may be encapsulated and suitable varieties of encapsulated epoxy-functional silanes may be found as quartz filled epoxy encapsulants, pre-mix formulations, sand-filled epoxy concrete patching materials, metal-filled epoxy materials, and the like. Commercial examples include the SILQUEST line of adhesion promoters (Momentive), including, without limitation, SILQUEST A136, A187, A1100, and the like, and mixtures or combinations thereof.

In an embodiment, the adhesion promoter is present in an amount sufficient to ensure optimal adhesion of the coating to the substrate, and if the coating described herein is applied directly to the substrate, to ensure proper adhesion of the coating described herein to any subsequently applied coating as well. The adhesion promoter is typically present in an amount from 0.05 to 2.5 wt. % of total resin solids, and, preferably, in an amount of from 0.1 to 2.0 wt. % of total resin solids.

The present compositions may be a clear (substantially lacking in color) where they are designed to be applied as a protective top coat over various substrates including, without limitation, glass, preferably tempered glass, metal, preferably primed metal, and the like. In certain embodiments, the compositions described herein may include a pigment. The pigment loading will depend on a number of factors including the desired opacity, color and chemical resistance. Typical, pigmented versions of the present composition include about 5 to about 25 and preferably about 10 to about 20 wt. % of one or more pigments.

The compositions described herein may include one or more additional components or additives. Conventional additives including surfactants, antioxidants, ultraviolet light absorbers and stabilizers, rheology control agents, coalescing agents and the like may also be added to the present coating composition.

The coating composition of the present invention may be prepared by conventional methods. For example, the coating composition may be prepared by blending the various components using a high speed disperser and milling equipment, such as a small media mill. For example, in the composition described herein, the PVDF resin component, pigment intermediates (including white pigment intermediates), colorant intermediates, and the like are combined, and then mixed with acrylic resin component, crosslinker, adhesion promoter, solvent, and/or any other additives.

The present invention also provides a method of coating a metal substrate to provide a tough resilient film on at least one surface of the substrate. The method includes applying the above described fluorocarbon polymer-based coating composition onto the metal surface to form a vinylidene difluoride-based resin film and heating the coated substrate to form a cured film adhered to the substrate surface.

A wide variety of substrates may be used with the coating compositions described herein. In an aspect, a suitable substrate as described herein must be able to withstand the high bake temperatures required to the cure the fluoropolymer resin described herein. Accordingly, in certain embodiments, the substrate is glass, preferably tempered glass that has been cleaned prior to coating, or metal, preferably aluminum with a primer coating already applied thereon. In a preferred aspect, the substrate is at least a portion of a solar panel made of tempered glass, primed aluminum, and/or a combination thereof.

Figure 1A:
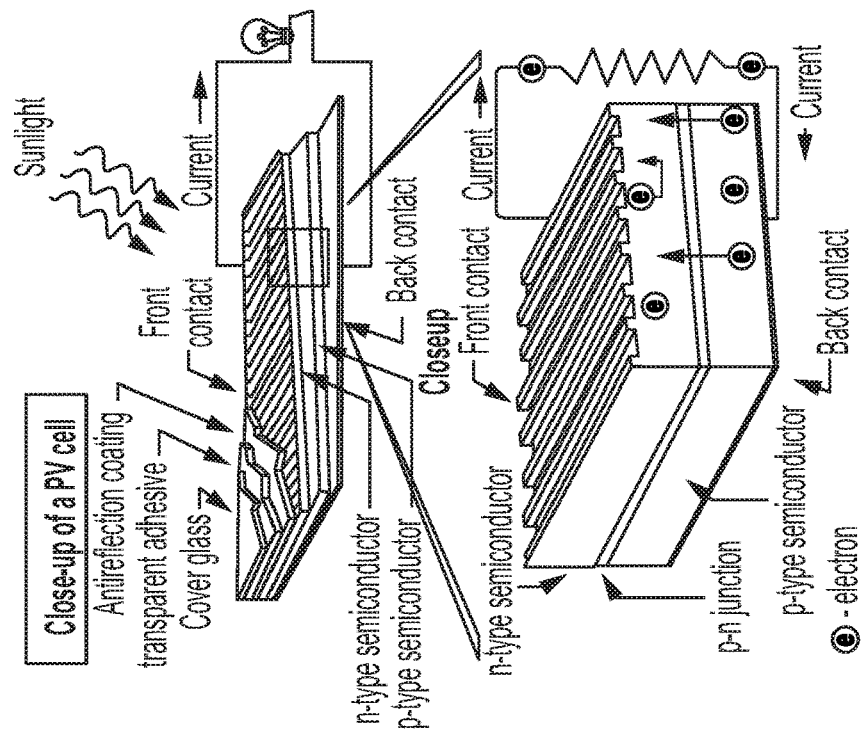

Conventionally, solar panels include glass surfaces as well as primed metal surfaces, as shown in FIGS. 1A and 1B. FIG. 1A shows a schematic of a photovoltaic cell with a glass surface to be placed in a frame made of primed aluminum (not shown) to form a solar panel assembly. The assembly is then mounted on a roof as shown in FIG. 1B.

In order for the entire solar panel to meet industry specification (such as the AAMA 2605 specification, for example), it is necessary to coat the glass surfaces and metal surfaces with different coating compositions. This increases the time and resources necessary for effective coating of the solar panel. Tiecoat compositions that are applied to the primed metal surface and also show adhesion to the glass surface have been used, but such coatings do not always meet the stringent requirements of the AAMA 2605 specification.

Surprisingly, and in contravention of bias in the industry, the coating composition described herein shows optimal adhesion and performance characteristics when applied to both the tempered glass surfaces and the primed aluminum surfaces of the solar panel, and also meets AAMA 2605 specifications. With proper racking and process design, it is also possible to simultaneously coat the glass and metal surfaces of the solar panel, thus reducing both time and materials cost.

The coating composition may be applied to the substrate surface using a variety of well-known techniques. For example, the composition may be sprayed onto the substrate surface by conventional methods known in the art. The metal surface is generally coated with a fluoropolymer- or acrylic-based primer coating, preferably a primer containing PVDF (such as a primer based on a blend of PVDF and a hydroxy functional acrylic copolymer) prior to the application of the present coating composition. A number of conventional fluoropolymer- and acrylic-based primers are known to those skilled in the art. Examples of suitable primers which may be applied to a metal surface prior to the present compositions are disclosed in U.S. Pat. No. 4,684,677, and in U.S. Pat. No. 6,017,639, incorporated herein by reference.

When coating the tempered glass surfaces or components of a solar panel, it is conventional to clean the glass surface with a solvent, typically isopropyl alcohol. However, it was discovered that small contaminants remained on the surface and caused coating flow defects when the glass surfaces were coated and cured. To remedy this problem, the process was modified to clean the tempered glass surface with a different solvent, specifically acetone. It was found that acetone more completely removed surface contamination. Additionally, because acetone is a VOC-exempt solvent, it presents fewer environmental or regulatory concerns.

When applied via spray methods, the compositions described herein, whether clear or pigmented, must be reduced with additional solvent prior to spray application. Reduction typically involves four parts by volume of paint thinned with 1 part reduction solvent to an applied viscosity of about 15 to 25 seconds in a #3 Zahn cup viscometer. Typically, a 70% PVDF coating would include about 35 to 45 wt % solids reduced to about 15 wt % solids after solvent reduction. Suitable solvents for use as reduction solvents include, for example, a blend of aromatic non-solvents such as, without limitation, xylene, toluene, and the like (for increasing coating resistivity), slow tail end solvents such as, without limitation, butyl carbitol, TEXANOL, and the like (for controlling flow characteristics and decreasing resistivity), and the like, and mixtures or combinations thereof.

Baking temperature is critical and must be high enough to cause the fluoropolymer particles, e.g., PVDF particles, present in the dispersion to alloy with the acrylic to form a film. Specifically, the bake temperature must be high enough to form an interpenetrating network (IPN) between reactive sites on the PVDF backbone and reactive sites on the acrylic backbone, and to allow crosslinking with the melamine curing agent via pendant functional groups on the acrylic backbone. A temperature sufficiently high, at least about 230° C. for a enough time in the oven, at least about 10 minutes, is necessary for this purpose.

The compositions described herein may be applied at a dry film thickness (DFT) suitable for the ultimate end use of the coating. When applied to solar panels intended to meet the AAMA 2605 specification, the aluminum frame has a primer applied thereon at a DFT of 5 to 10 micron, and the topcoat is applied at 30 to 38 micron. According to the AAMA 2605 specification, the total film thickness should be at least 30 micron or greater. The tempered glass surfaces of the solar panel do not require—and do not include—a primer coating. Instead, the tempered glass surfaces are coated at the topcoat thickness indicated in AAMA 2605 for a primed aluminum substrate, i.e. 30 to 38 micron.

EXAMPLES

The invention is illustrated by the following examples. It is to be understood that the particular examples, materials, amounts, and procedures are to be interpreted broadly in accordance with the scope and spirit of the inventions as set forth herein. Unless otherwise indicated, all parts and percentages are by weight, based on the total weight of the composition, and all molecular weights are weight average molecular weight. Unless otherwise specified, all chemicals used are commercially available from, for example, Sigma-Aldrich, St. Louis, Missouri.

Test Methods

Unless indicated otherwise, the following test methods were utilized in the Examples that follow.

A. Boiling Water Adhesion Test

The adhesion of a coating to a substrate over time is a measure of the strength of the bond formed between the coating and the substrate. This is determined by the boiling water adhesion test conducted according to the procedure described in AAMA 2605 test protocol, which requires three separate adhesion tests: (1) Dry adhesion (AAMA 2605 sec 8.4.1.1); (2) Tape off adhesion (AAMA 2605 sec 8.4.1.2); (3) Wet adhesion (AAMA 2605 sec 8.4.1.3); and (4) Boiling water adhesion (AAMA 2605 sec 8.4.1.4).

B. Pencil Hardness Test

The wear resistance and hardness of a coating applied to a substrate may be measured by its pencil hardness. The test for pencil hardness is conducted according to the procedure described in AAMA 2605 sec. 8.3. The minimum hardness to meet the AAMA 2605 specification is F to 2H.

Example 1. Preparation of Coating Composition

For the formulations tested in the following examples, a resin component including at about 21 percent by weight PVDF was combined with a dispersant in a mixer and agitated. The mixture was then milled on a sand mill, small media mill, or other suitable milling equipment until a 5.5 minimum grind rating (Hegman scale) was obtained.

For colored formulations, pigments were then separately combined with solvent and dispersant under a high speed disperser and agitated under high speed. This mixture was then milled on a sand mill, small media mill, or other suitable milling equipment until a 6.5 minimum grind reading (Hegman scale) was obtained.

The pigment mixture was then added to the resin mixture and additional components of the formula (e.g., acrylic resin, melamine resin crosslinker, adhesion promoter, and/or additional solvent) were then added under agitation. Viscosity and color adjustments were made by the addition of solvent and/or shading paste as needed.

Example 2. Effect of Adhesion Promoter

Formulations 1A through 6A were made as described in Example 1 and included a silane adhesion promoter (SILQUEST A187, Momentive Performance Materials) in varying amounts as shown in Table 1. A control thermoplastic formulation that does not include the adhesion promoter was also made. Tempered glass test panels were first cleaned with 100% acetone and the formulations 1A through 6A were spray-applied to the panels which were then baked to a temperature of 450 F. Each panel was then tested according to AAMA 2605 specifications. Results for boiling water adhesion, pencil hardness, and color change are shown in Table 1. Similar results were obtained when the same formulations were applied to primed aluminum test panels (not shown).

TABLE 1

Effect of Adhesion Promoter

| Sample | Adhesion promoter (wt %) | Boiling water test | Pencil hardness** | Color change* |
|---|---|---|---|---|
| Control | 0 | — | — | — |
| 1A | 0.15 | Fails | Fails F | Pass |
| 2A | 0.31 | Pass | Fails F | Pass |
| 3A | 0.46 | Pass | Pass F, H/Fails 2H | Pass |
| 4A | 0.62 | Pass | Pass F, H/Fails 2H | Pass |
| 5A | 0.77 | Pass | Pass F, H/Fails 2H | Pass |
| 6A | 0.92 | Pass | Pass F, H/Fails 2H | Pass |

*Color change is denoted as "pass" if there is less than 5 units of color change on any one of the L, a, b axes
**Pencil hardness specification is designated from F to 2H with an Eagle Turquoise pencil. A coating that meets AAMA 2605 specification must demonstrate a minimum hardness of at least F.

Example 3. Effect of Melamine Crosslinker

Formulations 1B to 3B were made as described in Example 1 and included a melamine crosslinker (CYMEL 327, Allnex) in varying amounts as shown in Table 2. A control formulation that does not include the crosslinker was also made. Tempered glass test panels were first cleaned with 100% acetone and the formulations 1B through 3B were spray-applied to the panels which were then baked to a temperature of 450 F. Each panel was then tested according to AAMA 2605 specifications. Results for boiling water adhesion, pencil hardness, and color change are shown in Table 2. Similar results were obtained when the same formulations were applied to primed aluminum test panels (not shown).

TABLE 2

Effect of Crosslinker

| Sample | Melamine Crosslinker (wt %) | Boiling water test | Pencil hardness** | Color change* |
|---|---|---|---|---|
| Control | 0 | Fail | — | — |
| 1B | 3.0 | Pass | Pass F, H, 2H | Pass |
| 2B | 6.0 | Pass | Pass F, H, 2H | Pass |
| 3B | 9.0 | Pass | Pass F. H/Fails 2H | Pass |

*Color change is denoted as "pass" if there is less than 5 units of color change on any one of the L, a, b axes
**Pencil hardness specification is designated from F to 2H with an Eagle Turquoise pencil. A coating that meets AAMA 2605 specification must demonstrate a minimum hardness of at least F.

The complete disclosure of all patents, patent applications, and publications, and electronically available material cited herein are incorporated by reference. The foregoing detailed description and examples have been given for clarity of understanding only. No unnecessary limitations are to be understood therefrom. The invention is not limited to the exact details shown and described, for variations obvious to one skilled in the art will be included within the invention defined by the claims. The invention illustratively disclosed herein suitably may be practiced, in some embodiments, in the absence of any element which is not specifically disclosed herein.

What is claimed is:

1. A one-coat system, comprising:
a substrate comprising at least a portion of a solar panel including a tempered glass surface, a primed aluminum surface, or a combination thereof;
and a film formed from a dispersed fluoropolymer resin composition comprising polyvinylidene fluoride (PVDF) and
an adhesion promoter,
wherein the system is a clear exterior coating system applied at a dry film thickness (DFT) of 30 to 38 μm that passes the AAMA 2605 specification.

2. The system of claim 1, wherein the substrate is capable of withstanding a bake temperature of at least 230° C. required to cure the dispersed fluoropolymer resin composition applied thereon.

3. The system of claim 1, wherein the dispersed fluoropolymer resin composition further comprises:
at least one organic solvent; and
at least one amino-functional crosslinker.

4. The system of claim 3, wherein the at least one organic solvent is selected from aromatic solvents, non-aromatic solvents, alcohols, ketones, ketone-alcohols, glycol ethers, glycerol ether acetates, and mixtures or combinations thereof.

5. The system of claim 3, wherein the at least one organic solvent is selected from a non-aromatic ester, a non-aromatic ketone, or a mixture thereof.

6. The system of claim 3, wherein the at least one amino-functional crosslinker is selected from one or more aminoplast resins derived from the reaction of alcohol or formaldehyde with melamine, urea or benzoguanamine.

7. The system of claim 6, wherein the amino-functional crosslinker is a melamine.

8. The system of claim 1, wherein the dispersed fluoropolymer resin composition further includes a hydroxyl-functional acrylic polymer.

9. The system of claim 1, wherein the adhesion promoter is selected from organo-functional silanes, amino-functional silanes, halosilanes, silazanes, or combinations thereof.

10. The system of claim 9, wherein the adhesion promoter is an organo-functional silane with epoxy functionality.

11. The system of claim 10, wherein the adhesion promoter is a trimethoxysilane with epoxy functionality.

* * * * *